(12) United States Patent
Kobayashi

(10) Patent No.: US 11,961,751 B2
(45) Date of Patent: Apr. 16, 2024

(54) CEILING TRANSPORT VEHICLE

(71) Applicant: MURATA MACHINERY, LTD., Kyoto (JP)

(72) Inventor: Makoto Kobayashi, Ise (JP)

(73) Assignee: MURATA MACHINERY, LTD., Kyoto (JP)

( * ) Notice: Subject to any disclaimer, the term of this patent is extended or adjusted under 35 U.S.C. 154(b) by 393 days.

(21) Appl. No.: 17/433,062

(22) PCT Filed: Dec. 11, 2019

(86) PCT No.: PCT/JP2019/048567
§ 371 (c)(1),
(2) Date: Aug. 23, 2021

(87) PCT Pub. No.: WO2020/174809
PCT Pub. Date: Sep. 3, 2020

(65) Prior Publication Data
US 2022/0157630 A1  May 19, 2022

(30) Foreign Application Priority Data

Feb. 25, 2019 (JP) ................................ 2019-031995

(51) Int. Cl.
*H01L 21/677* (2006.01)
*B65G 1/04* (2006.01)
(Continued)

(52) U.S. Cl.
CPC ...... *H01L 21/67724* (2013.01); *B65G 1/0457* (2013.01); *B66C 19/00* (2013.01);
(Continued)

(58) Field of Classification Search
CPC ............... H01L 21/6773; H01L 21/677; H01L 21/67733; H01L 21/67724; F16F 15/085;
(Continued)

(56) References Cited

U.S. PATENT DOCUMENTS 3,601,228 A * 8/1971 Nashif .................... F16F 7/108
188/268
5,178,357 A * 1/1993 Platus .................... F16F 3/026
248/619

(Continued)

FOREIGN PATENT DOCUMENTS

| JP | 2001-163447 A | 6/2001 |
| JP | 2017-145134 A | 8/2017 |
| WO | 2018/079146 A1 | 5/2018 |

OTHER PUBLICATIONS

Official Communication issued in International Patent Application No. PCT/JP2019/048567, dated Sep. 2, 2021.
(Continued)

*Primary Examiner* — Glenn F Myers
(74) *Attorney, Agent, or Firm* — Keating & Bennett, LLP

(57) ABSTRACT

An overhead transport vehicle includes an elevator including a base and a first support supporting the base to be vertically movable from below in a vertical direction through a vibration isolator. The vibration isolator includes a first biasing portion in contact with both of the support and the base to urge a first body and the base in a direction away from each other, and a second biasing portion at one of the first body and the base to come into contact with both of the first body and the base and urge the first body and the base in a direction away from each other when a load equal to or greater than a predetermined value is applied to the first biasing portion.

8 Claims, 7 Drawing Sheets

(51) Int. Cl.
*B66C 19/00* (2006.01)
*F16F 15/08* (2006.01)
(52) U.S. Cl.
CPC .......... *F16F 15/08* (2013.01); *H01L 21/6773* (2013.01); *H01L 21/67733* (2013.01); *B65G 2201/0297* (2013.01)
(58) Field of Classification Search
CPC .......... F16F 15/08; F16F 15/06; B66C 19/00; B65G 1/0457; B65G 1/0464; B65G 2201/0297; Y02T 30/00
See application file for complete search history.

(56) References Cited

U.S. PATENT DOCUMENTS

| | | | |
|---|---|---|---|
| 2006/0179729 A1* | 8/2006 | Li | F16F 15/06 52/167.7 |
| 2012/0267505 A1* | 10/2012 | Guest | F16F 7/1028 248/560 |
| 2017/0243775 A1 | 8/2017 | Kobayashi | |
| 2019/0241406 A1 | 8/2019 | Kobayashi | |

OTHER PUBLICATIONS

English translation of Official Communication issued in International Patent Application No. PCT/JP2019/048567, dated Mar. 3, 2020.

Official Communication issued in International Patent Application No. PCT/JP2019/048567, dated Mar. 3, 2020.

\* cited by examiner

CEILING TRANSPORT VEHICLE

BACKGROUND OF THE INVENTION

1. Field of the Invention

An aspect of a preferred embodiment of the present invention relates to an overhead transport vehicle.

2. Description of the Related Art

An overhead transport vehicle is known which includes a body configured to travel along a track and an elevator including a gripper to grip an article and configured to ascend and descent with respect to the body by reeling and unreeling a plurality of suspension members. For example, WO2018/079146 discloses an overhead transport vehicle including an elevator including a base having a gripper and a plurality of shock absorbers each including a support to support the base to be vertically movable from below in a vertical direction via a vibration isolator and to which suspensions are attached, in which the shock absorbers are connected by a link. In this overhead transport vehicle, since the link operates to ensure a similarity of respective distances between the base and the support connected to each other in each of the shock absorbers connected to each other, it is possible to suppress swaying of the article while reducing vibration transmitted to the article.

SUMMARY OF THE INVENTION

In the conventional overhead transport vehicle described above, a repelling force is adjusted to ensure that the spring member as a vibration isolator functions when the weight of an article (FOUP) is heaviest (when the FOUP contains an object that is at the maximum capacity), thereby preventing vibration from being transmitted to the article. However, with the vibration isolator adjusted in this way, the repelling function does not work on a relatively light article and may fail to prevent vibration.

Preferred embodiments of the present invention provide overhead transport vehicles each capable of reducing vibration transmitted to the article even when the weights of transported articles vary.

An overhead transport vehicle according to an aspect of a preferred embodiment of the present invention includes a body to travel along a track and an elevator to be elevated and lowered by a suspension with respect to the body, the elevator including a gripper to grip an article. The elevator includes a base including the gripper and a support supporting the base to be vertically movable from below in a vertical direction through a vibration isolator. The vibration isolator includes a first biasing portion disposed in contact with both of the support and the base to urge the support and the base in a direction away from each other, and a second biasing portion disposed at one of the support and the base to come into contact with both of the support and the base and urge the support and the base in a direction away from each other when a load equal to or greater than a predetermined value is applied to the first biasing portion.

In the overhead transport vehicle with this configuration, when a relatively light article is gripped, only the biasing force of the first biasing portion is exerted between the base and the support, and when a relatively heavy article heavier than the predetermined value is gripped, both of the biasing force of the first biasing portion and the biasing force of the second biasing portion are exerted between the base and the support. In other words, in the overhead transport vehicle with this configuration, when the gripped article is heavier than the predetermined value, the second biasing portion exerts a biasing force between the base and the support. With this configuration, when a relatively light article is gripped, the action of the first biasing portion can reduce vibration transmitted to the article, and when a relatively heavy article is gripped, the actions of the first biasing portion and the second biasing portion can reduce vibration transmitted to the article. As a result, even when the weights of transported articles vary, vibration transmitted to the article can be reduced or minimized.

In an overhead transport vehicle according to an aspect of a preferred embodiment of the present invention, a plurality of the supports may be disposed and coupled to each other by a link, and the link may operate such that respective distances between the supports coupled to each other and the base are brought closer to each other. In the overhead transport vehicle with this configuration, since the link brings the respective distances between the supports coupled to each other and the base closer to each other, rolling motion in the base can be reduced or prevented. Thus, inclination in the base can be reduced and consequently, swaying of the article can be reduced or prevented.

In an overhead transport vehicle according to an aspect of a preferred embodiment of the present invention, the second biasing portion may include a viscoelastic material or portion. With this configuration, swaying of the transported object can be attenuated, and swaying of the article can be effectively reduced or prevented.

In an overhead transport vehicle according to an aspect of a preferred embodiment of the present invention, the article may be an empty container that does not contain a content or may be a container that contains the content, and the first biasing portion may be preloaded such that the first biasing portion is not compressed when the empty container is gripped. With this configuration, since the first biasing portion is not contracted even when an empty container is gripped, the second biasing portion can be readily prevented from coming into contact with both of the support and the base at the point of time when the empty container is gripped.

In an overhead transport vehicle according to an aspect of a preferred embodiment of the present invention, the elevator may further include a shaft portion including one end disposed at the support, the shaft portion passing through a through hole provided in the base. The shaft portion may extend through the first biasing portion. At the other end of the shaft portion, a clamp may be disposed to clamp a third biasing portion with the base. The third biasing member may come into contact with both of the base and the clamp and urge the base and the clamp in a direction away from each other. With this configuration, vibration in rebounding when the second biasing portion is compressed can be reduced or prevented.

In an overhead transport vehicle according to an aspect of a preferred embodiment of the present invention, the third biasing portion may include a viscoelastic material or portion. In this configuration, vibration in rebounding can be attenuated, and swaying of the article can be effectively reduced or prevented.

According to an aspect of a preferred embodiment of the present invention, vibration transmitted to the article can be reduced even when the weights of transported articles vary.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described in detail below with reference to the drawings. In the description of the drawings, the same elements are denoted by the same reference signs and an overlapping description is omitted.

Figure 1:
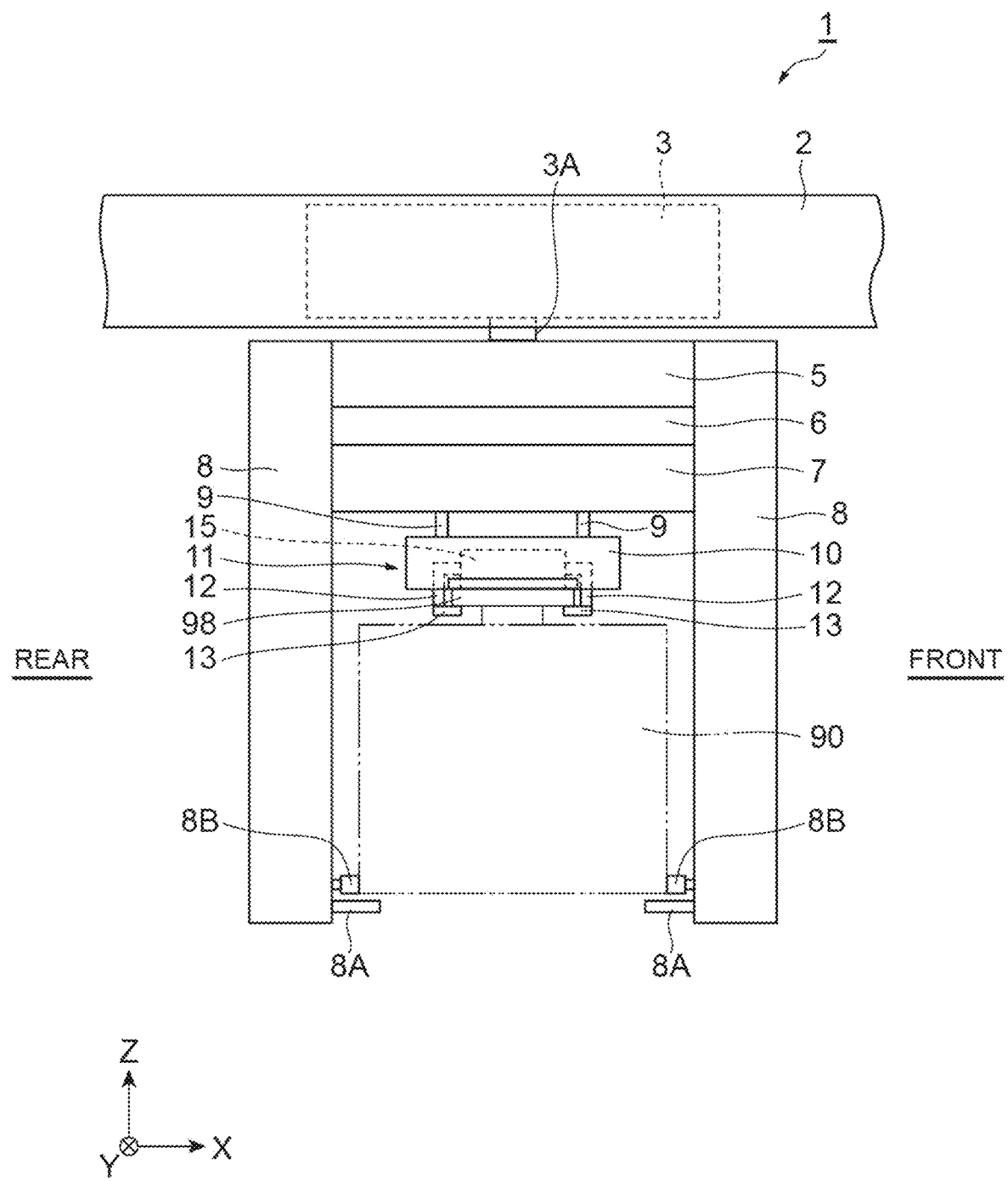
FIG. 1 is a front view illustrating an overhead transport vehicle according to a preferred embodiment of the present invention.
Figure 2:
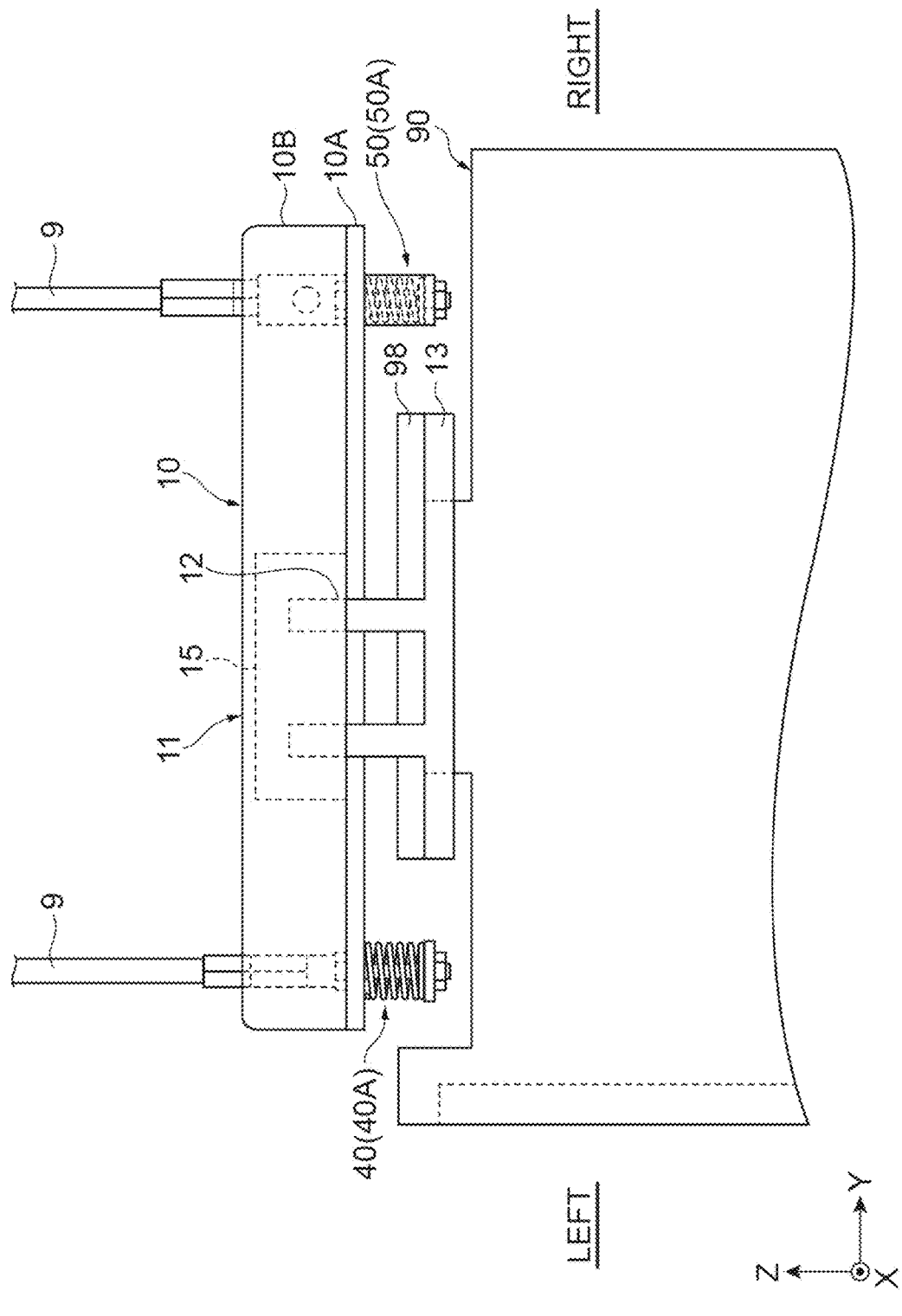
FIG. 2 is a side view of the overhead transport vehicle in FIG. 1 as viewed from the front.

FIG. 1 is a front view illustrating an overhead transport vehicle according to a preferred embodiment, and FIG. 2 is a side view of the overhead transport vehicle in FIG. 1 as viewed from the front. In FIG. 1 and FIG. 2, a link mechanism 70 is not illustrated. The overhead transport vehicle 1 illustrated in FIG. 1 travels along a traveling rail (track) 2 provided at a position higher than the floor, such as a ceiling of a clean room. The overhead transport vehicle 1 transports a front opening unified pod (FOUP) (article, container) 90 as an article, for example, between a storage facility and a predetermined load port. The FOUP 90 accommodates, for example, a plurality of semiconductor wafers or reticles. The FOUP 90 includes a flange 98 held by the overhead transport vehicle 1.

In the following description, the left-right direction (X-axis direction) in FIG. 1 is defined as the front-rear direction of the overhead transport vehicle 1, for convenience of explanation. The up-down direction in FIG. 1 is defined as the up-down (vertical) direction (Z-axis direction) of the overhead transport vehicle 1. The depth direction in FIG. 1 is defined as the left-right direction or the width direction (Y-axis direction) of the overhead transport vehicle 1. The X axis, the Y axis, and the Z axis are orthogonal to each other.

Figure 4:
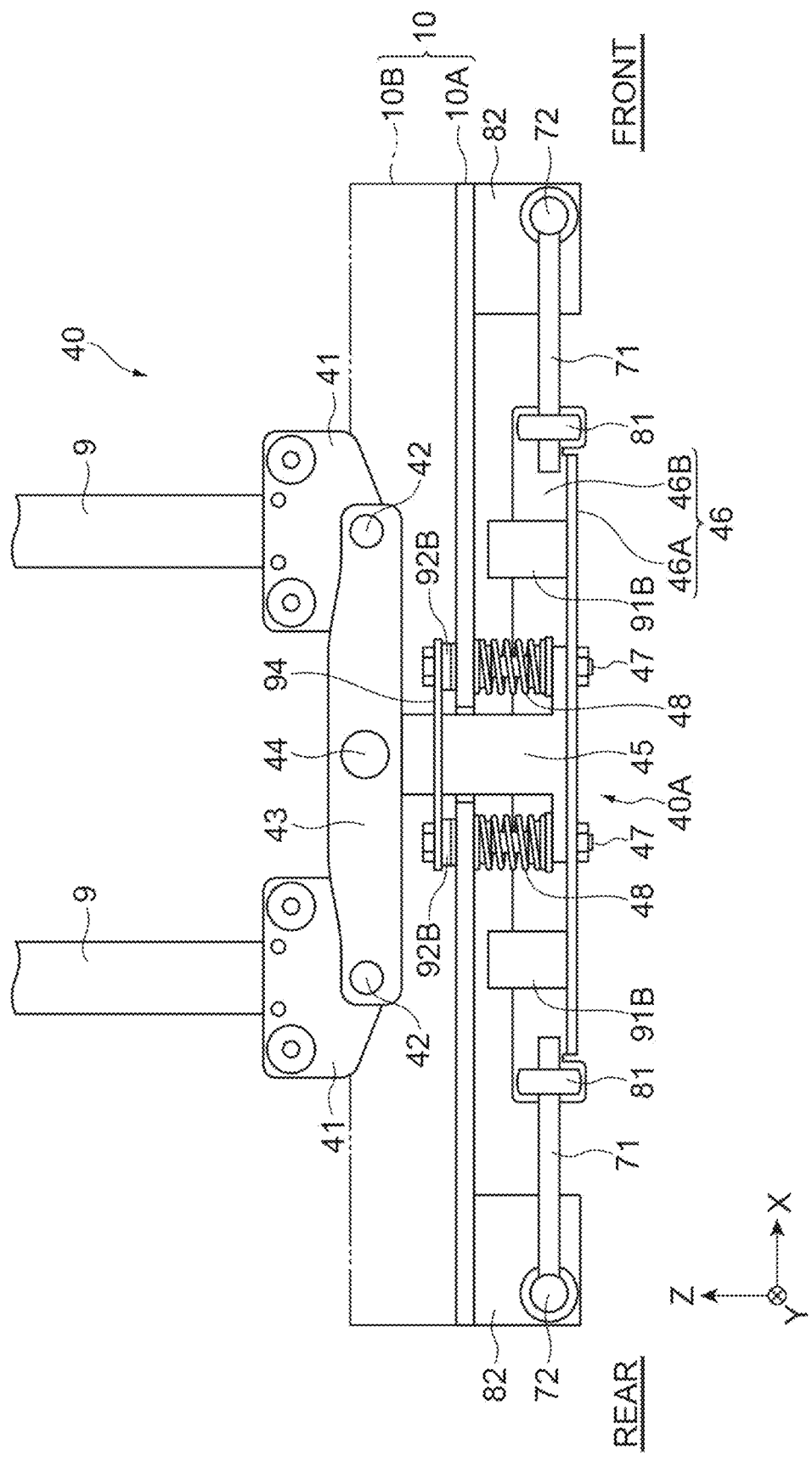
FIG. 4 is a front view of a second support viewed from the left.
Figure 5:
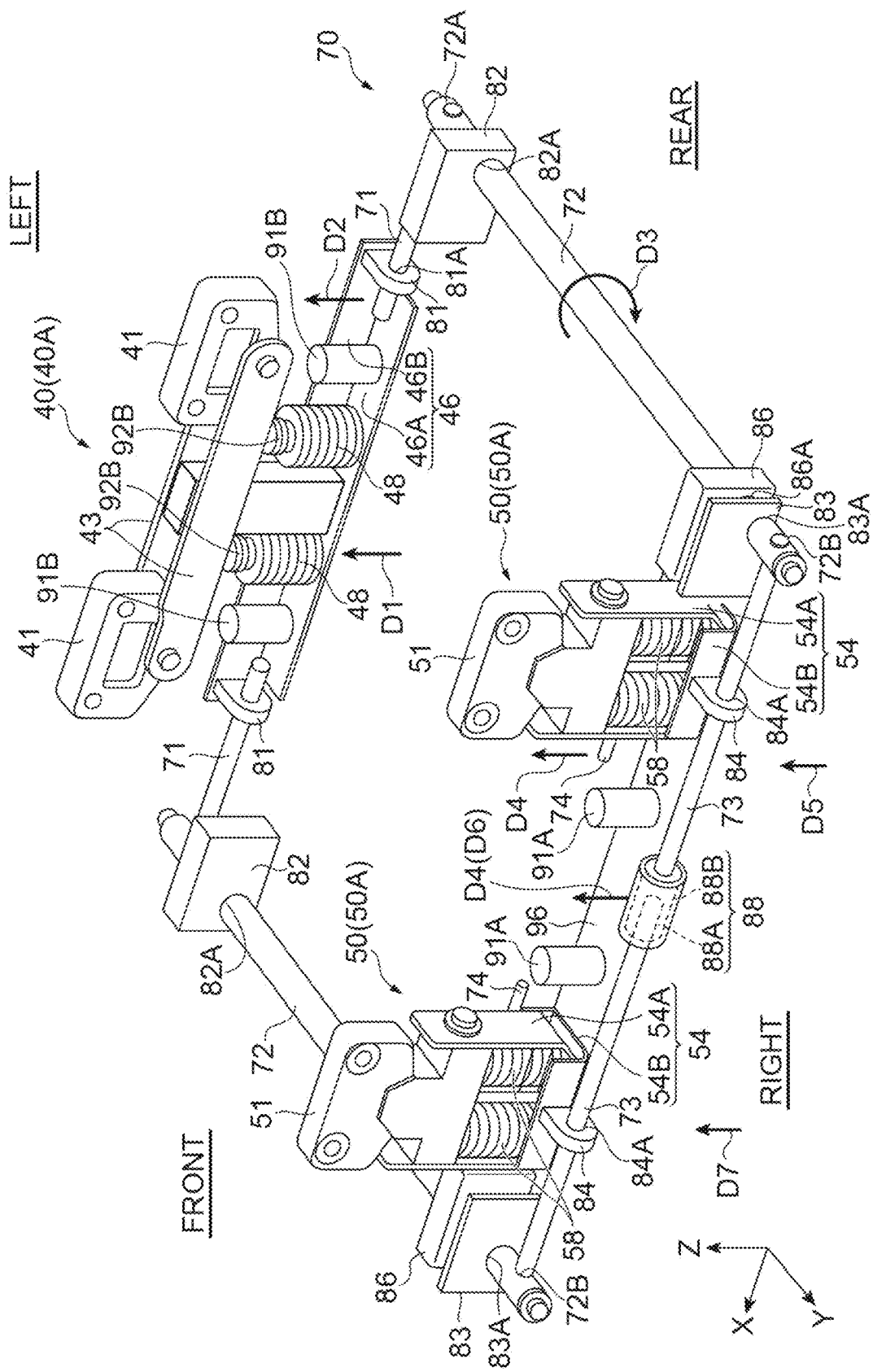
FIG. 5 is a perspective view of a link mechanism.

As illustrated in FIG. 1, the overhead transport vehicle 1 includes a traveling drive unit 3, a horizontal drive unit (body) 5, a rotary drive unit (body) 6, an elevation drive unit (body) 7, an elevating device (elevator) 10, a holding device (gripper) 11, a first support (support) 50 (see FIG. 3), a second support (support) 40 (see FIG. 4), and a link mechanism 70 (see FIG. 5).

The overhead transport vehicle 1 is provided with a pair of covers 8 and 8 in the front-rear direction to cover the horizontal drive unit 5, the rotary drive unit 6, the elevation drive unit 7, the elevating device 10, and the holding device 11. A pair of covers 8 and 8 define a space to accommodate the FOUP 90 below the holding device 11 in a state in which the elevating device 10 is lifted to a lifting end. A drop-preventing mechanism 8A prevents dropping of the FOUP 90 held by the holding device 11 in a state in which the elevating device 10 is lifted to the lifting end. A swaging suppression mechanism 8B suppresses swaging of the FOUP 90 held by the holding device 11 in the front-rear direction (traveling direction) and the left-right direction of the overhead transport vehicle 1 during travel.

The traveling drive unit 3 moves the overhead transport vehicle 1 along the traveling rail 2. The traveling drive unit 3 is disposed inside the traveling rail 2. The traveling drive unit 3 drives a roller (not illustrated) traveling on the traveling rail 2. The horizontal drive unit 5 is provided under the traveling drive unit 3 with a shaft 3A interposed. The horizontal drive unit 5 moves the rotary drive unit 6, the elevation drive unit 7, and the elevating device 10 in a horizontal plane in a direction (left-right direction) orthogonal to the extending direction of the traveling rail 2. The rotary drive unit 6 rotates the elevation drive unit 7 and the elevating device 10 in a horizontal plane. The elevation drive unit 7 elevates and lowers the elevating device 10 by reeling and unreeling four belts (suspension members) 9. The belts 9 in the elevation drive unit 7 may be any appropriate suspension members such as wires and ropes.

As illustrated in FIG. 1 and FIG. 2, the elevating device 10 in the present preferred embodiment is configured to be elevated and lowered by the elevation drive unit 7 and functions as an elevation stage in the overhead transport vehicle 1. The elevating device 10 includes a holding device 11 to grip the FOUP 90 and is elevated and lowered by the belts 9 with respect to the horizontal drive unit 5, the rotary drive unit 6, and the elevation drive unit 7 as the body. The holding device 11 holds the FOUP 90. The holding device 11 includes a pair of arms 12 and 12 shaped like a letter L, hands 13 and 13 fixed to the respective arms 12 and 12, and an opening/closing mechanism 15 to open and close a pair of arms 12 and 12.

A pair of arms 12 and 12 are provided at the opening/closing mechanism 15. The opening/closing mechanism 15 moves a pair of arms 12 and 12 in a direction bringing them closer to each other and in a direction bringing them apart from each other. The opening/closing mechanism 15 operates to allow a pair of arms 12 and 12 to advance and retract in the front-rear direction. A pair of hands 13 and 13 fixed to the arms 12 and 12 are thus opened and closed. In the present preferred embodiment, the height position of the holding device 11 (elevating device 10) is adjusted such that the holding surfaces of the hands 13 are below the height of the lower surface of the flange 98 when a pair of hands 13 and 13 are open. Then, in this state, a pair of hands 13 and 13 are closed, so that the holding surfaces of the hands 13 and 13 advance to below the lower surface of the flange 98. In this state, the elevating device 10 is lifted, so that a pair of hands 13 and 13 hold (grip) the flange 98 to support the FOUP 90.

The elevating device 10 includes a base 10A to which the holding device 11 is provided, a cover 10B covering the base 10A, first supports 50 supporting the base 10A to be vertically movable from below in the vertical direction through vibration isolators 50A, and a second support 40 supporting the base 10A to be vertically movable from below in the vertical direction through a vibration isolator 40A.

Figure 3:
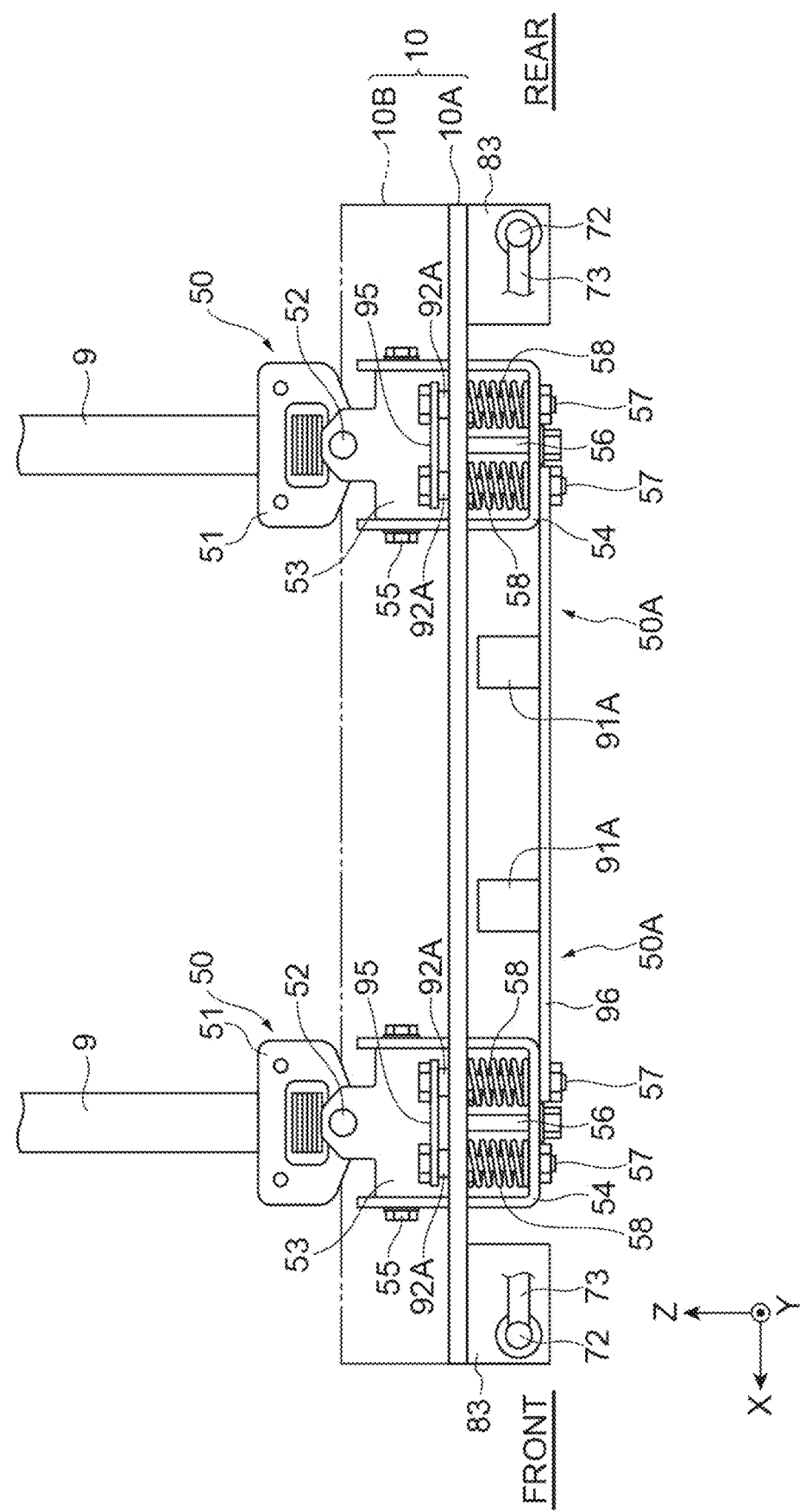
FIG. 3 is a front view of first supports viewed from the right.

FIG. 3 is a front view illustrating an overall configuration of the first supports, and FIG. 4 is a front view illustrating an overall configuration of the second support. In FIG. 3, a portion of the first body member 54 and a portion of the link mechanism 70 coupled to the first support 50 described later are not illustrated for convenience of explanation. As illustrated in FIG. 3 and FIG. 4, the first supports 50 and the second support 40 are a mechanism that couples the belts 9 and the elevating device (see FIG. 1) and a mechanism that reduces or prevents transmission of vibration to the FOUP 90 when the traveling drive unit 3 travels or when the elevating device 10 is elevated and lowered.

As illustrated in FIG. 2, the first supports 50 are provided on the right side of the elevating device 10 in the left-right direction. As illustrated in FIG. 3, the first supports 50 are provided at two places in the front-rear direction. The first supports 50 each include a connection member 51, a swingable member 53, a first body member 54, a second body member 56, first shaft portions (shaft portions) 57 and 57, a coupling member 96, a clamping member 95, and a vibration isolator 50A. The vibration isolator 50A includes a pair of first biasing portions 58 and 58, a pair of second biasing portions 91A and 91A, and a pair of third biasing portions 92A and 92A.

The connection member 51 is a member attached to the belt 9. The swingable member 53 is a member coupled to the connection member 51. The swingable member 53 is rotatably coupled to the connection member 51 through a first pin member 52. The first body member 54 is a substantially U-shaped member including an opening at its upper end and has a bottom formed to be flat in the horizontal direction. The first body member 54 has its upper end coupled to both ends of the swingable member 53 by a bolt 55. The first body member 54 includes a first support member 54A (see FIG. 5 and FIG. 6) and a second support member 54B (see FIG. 5 and FIG. 6).

The first support member 54A supports the first biasing portions 58 from below. The second support member 54B is a member orthogonal to the first support member 54A. The second body member 56 is a member coupling the substantially center portions of the swingable member 53 and the first body member 54 in the front-rear direction. A pair of first shaft portions 57 and 57 are rod-shaped members extending upward from the first support member 54A and are disposed to sandwich the second body member 56 in the front-rear direction. One end of each first shaft portion 57 is connected to the first body member 54. The first shaft portion 57 passes through a through hole formed in the base 10A. At the other end closer to the base 10A in the first shaft portion 57, the clamping member 95 is provided to clamp the third biasing portion 92A with the base 10A.

A pair of first biasing portions 58 and 58 are compression coil springs having a predetermined spring constant and through which a pair of first shaft portions 57 and 57 are respectively disposed. The respective upper ends of a pair of first biasing portions 58 and 58 come into contact with the base 10A, and the respective lower ends thereof are disposed in contact with the first support member 54A. In other words, a pair of first biasing portions 58 and 58 are each provided in contact with both of the first support member 54A and the base 10A and urge the first support member 54A and the base 10A in a direction away from each other. The first biasing portions 58 defining and functioning as a vibration isolator play a role of reducing vibration transmitted between members in contact with each other.

A pair of second biasing portions 91A and 91A are members made of urethane rubber and have viscoelasticity. When a load equal to or greater than a predetermined value is not applied to the first biasing portions 58 and 58, the respective upper ends of a pair of second biasing portions 91A and 91A are spaced apart from the base 10A, and the respective lower ends thereof are disposed in contact with the first support member 54A. In other words, when a load equal to or greater than a predetermined value is not applied to the first biasing portions 58 and 58, a pair of second biasing portions 91A and 91A are each provided in contact only with the first support member 54A. When a load equal to or greater than a predetermined value is applied to the first biasing portions 58 and 58, the second biasing portions 91A and 91A come into contact with both of the coupling member 96 and the base 10A and urge the coupling member 96 and the base 10A in a direction away from each other.

A pair of third biasing portions 92A and 92A are members made of urethane rubber and have viscoelasticity. A pair of third biasing portions 92A and 92A are each disposed between the base 10A and the clamping member 95. A pair of third biasing portions 92A and 92A come into contact with both of the base 10A and the clamping member 95 and urge the base 10A and the clamping member 95 in a direction away from each other.

As illustrated in FIG. 2, the second support 40 is provided on the left side of the elevating device 10 in the left-right direction. As illustrated in FIG. 4, the second support 40 is provided near the center in the front-rear direction. The second support 40 includes connection members 41 and 41, a swingable member 43, a third body member 45, a fourth body member 46, second shaft portions (shaft portions) 47 and 47, a clamping member 94, and a vibration isolator 40A. The vibration isolator 40A includes a pair of first biasing portions 48 and 48, a pair of second biasing portions 91B and 91B, and a pair of third biasing portions 92B and 92B.

The connection members 41 and 41 are members to which the belts 9 and 9 are attached. The swingable member 43 is a member coupling a pair of connection members 41 and 41 to the third body member 45. A pair of connection members 41 and 41 and the swingable member 43 are coupled in a bidirectionally rotatable manner and coupled through a pair of third pin members 42 and 42. The swingable member 43 and the third body member 45 are coupled in a bidirectionally rotatable manner and coupled through a fourth pin member 44.

The fourth body member 46 is a plate member coupled to the lower end of the third body member 45 and extending in the horizontal direction. The fourth body member 46 includes a third support member 46A and a fourth support member 46B. The third body member 45 supports the first biasing portions 48 and 48 from below. The third support member 46A supports the second biasing portions 91B and 91B from below. The fourth support member 46B is a member orthogonal to the third support member 46A. A pair of second shaft portions 47 and 47 are rod-shaped members extending upward from the lower end of the third body member 45 and disposed to sandwich the third body member 45 in the front-rear direction. One end of each second shaft portion 47 is connected to the fourth body member 46. The second shaft portion 47 passes through a through hole in the base 10A. At the other end closer to the base 10A in the second shaft portion 47, the clamping member 94 is provided to clamp the third biasing portions 92B with the base 10A.

A pair of first biasing portions 48 and 48 are compression coil springs having a predetermined spring constant and through which a pair of second shaft portions 47 and 47 are disposed. The respective upper ends of a pair of first biasing portions 48 and 48 come into contact with the base 10A, and the respective lower ends thereof are disposed in contact with the third body member 45. In other words, a pair of first biasing portions 48 and 48 are each provided in contact with both of the third body member 45 and the base 10A and urge the third body member 45 and the base 10A in a direction away from each other. The first biasing portions 48 defining and functioning as a vibration isolator play a role of reducing vibration transmitted between members in contact with each other.

A pair of second biasing portions 91B and 91B are members made of urethane rubber and have viscoelasticity. When a load equal to or greater than a predetermined value is not applied to the first biasing portions 48 and 48, the respective upper ends of a pair of second biasing portions 91B and 91B are spaced apart from the base 10A, and the respective lower ends thereof are disposed in contact with the third support member 46A. In other words, when a load equal to or greater than a predetermined value is not applied to the first biasing portions 48 and 48, a pair of second biasing portions 91B and 91B are each provided in contact only with the third support member 46A. When a load equal to or greater than a predetermined value is applied to the first biasing portions 48 and 48, the second biasing portions 91B and 91B each come into contact with both the third support member 46A and the base 10A and urge the third support member 46A and the base 10A in a direction away from each other.

A pair of third biasing portions 92B and 92B are members made of urethane rubber and have viscoelasticity. The third biasing portions 92B and 92B are each disposed between the clamping member 94 and the base 10A and come into contact with both of the clamping member 94 and the base 10A and urge the clamping member 94 and the base 10A in a direction away from each other.

Figure 6:
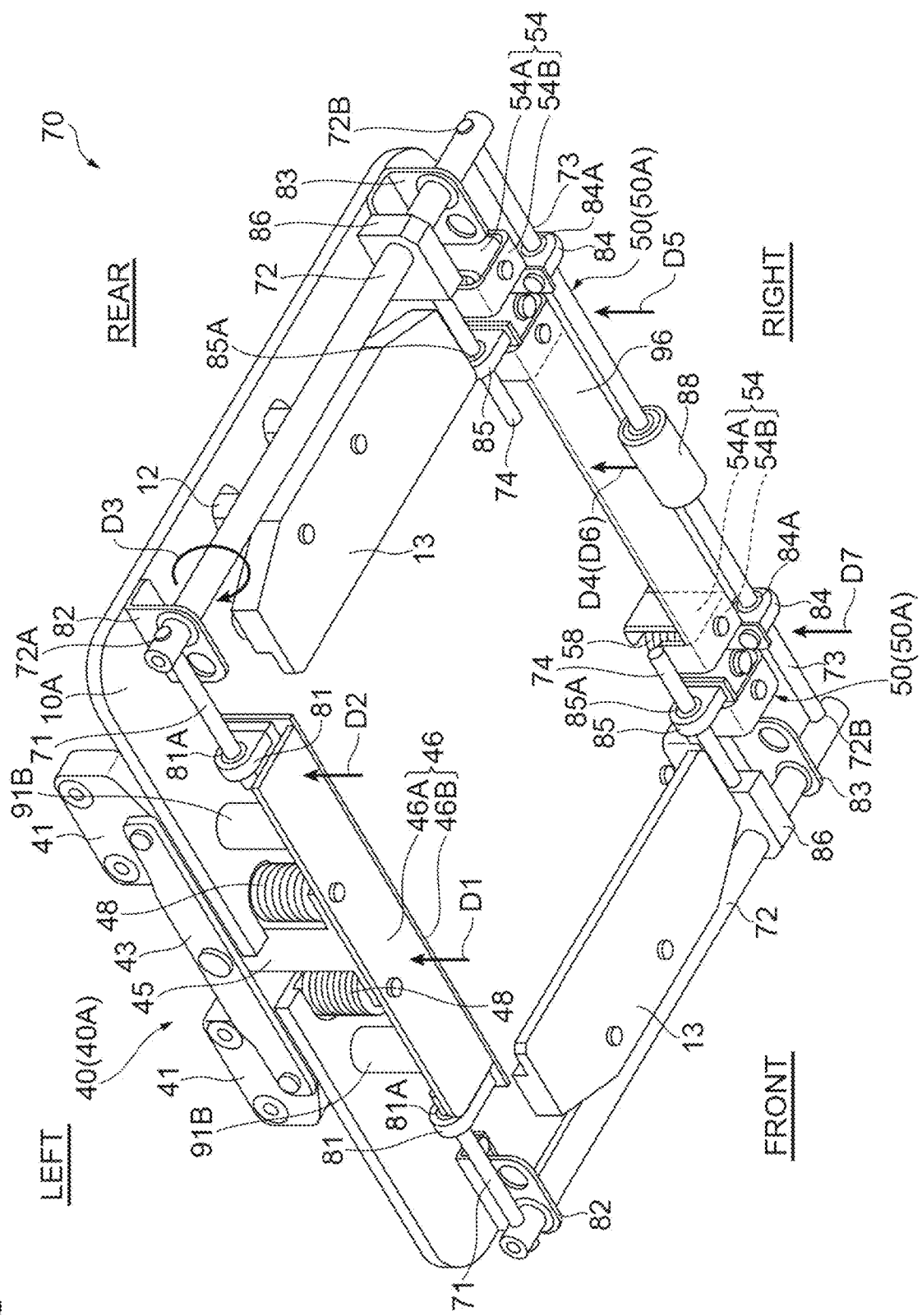
FIG. 6 is a perspective view of the link mechanism disposed on the back surface of a base.
Figure 7:
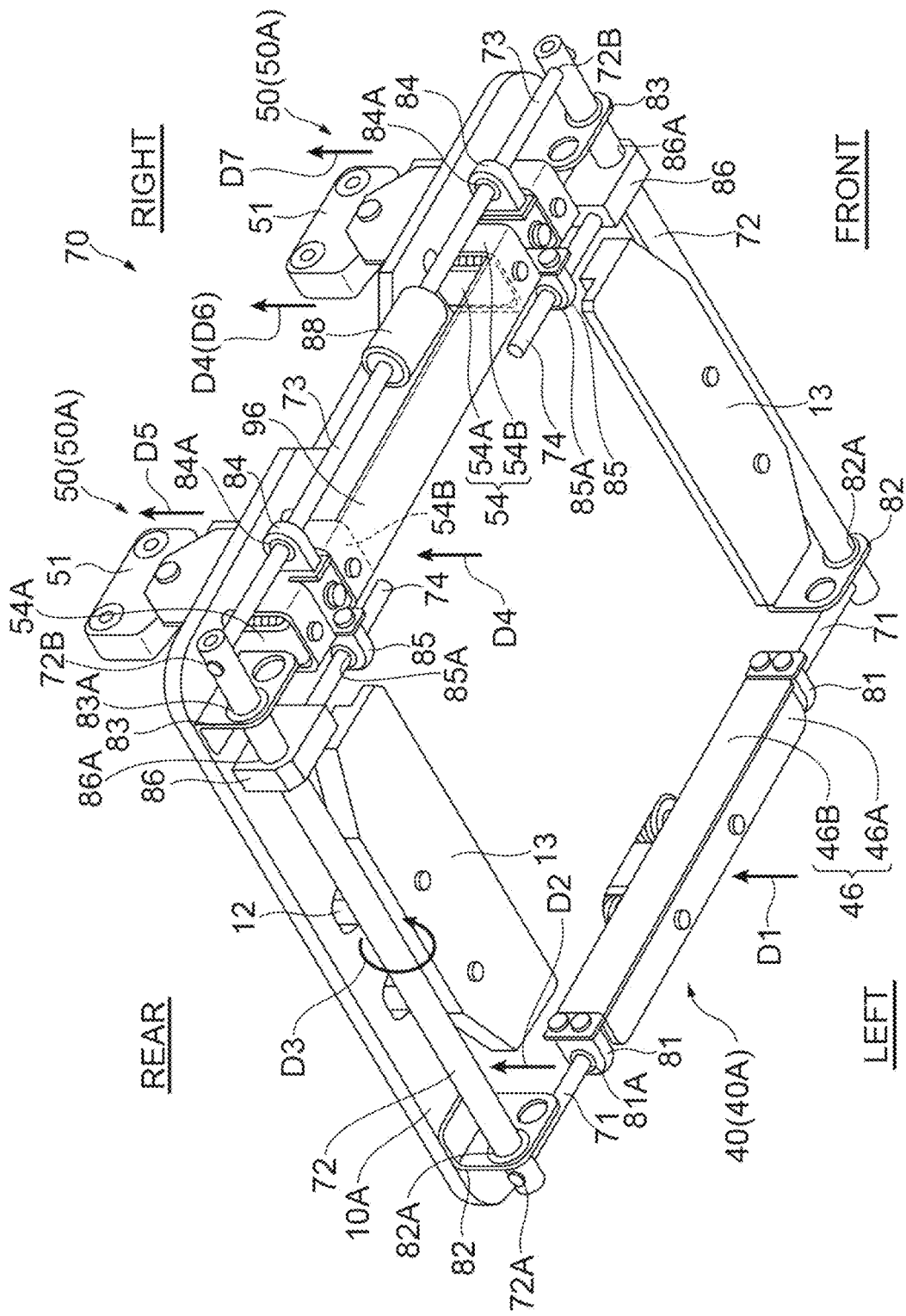
FIG. 7 is a perspective view of the link mechanism disposed on the back surface of the base.

As illustrated in FIG. 5 to FIG. 7, the link mechanism 70 couples two first supports 50 and the second support 40 arranged in the left-right direction (width direction) orthogonal to both of the front-rear direction (traveling direction) and the up-down direction (vertical direction) and couples two first supports 50 and 50 arranged in the front-rear direction. The link mechanism 70 operates such that the distance between the first body member (coupling member 96) and the base 10A in the first support 50 and the distance between the fourth body member 46 and the base 10A in the second support 40 are brought closer to each other. The link mechanism 70 also operates such that the distance between the first body member 54 and the base 10A in the first support 50 disposed on the left side and the distance between the first body member 54 and the base 10A in the first support 50 disposed on the right side are brought closer to each other. The detail of the link mechanism 70 will be described below.

The link mechanism 70 includes first shafts 71, second shafts 72, third shafts 73, fourth shafts 74, first bushings 81, first blocks 82, second blocks 83, second bushings 84, third bushings 85, fixing portions 86, and a coupling portion 88.

The first shafts 71 are supported by the first bushings 81 fastened to the fourth support member 46B in the second support 40 and extend in the front-rear direction. Each first shaft 71 passes through a through hole 81A in the first bushing 81 and is rotatable with respect to the first bushing 81 and slidable in the axial direction. The material of the first bushings 81 is selected as appropriate such that the first shafts 71 have predetermined rotatability and predetermined slidability. Two first shafts 71 arranged in the front-rear direction are disposed substantially on a straight line in the front-rear direction. The first shafts 71 are disposed in a line with the second shaft portions 47 and 47 (see FIG. 4) including a pair of first biasing portions 48 and 48 in the front-rear direction.

The third shafts 73 are supported by the second bushings 84 fastened to the second support members 54B in the first support 50 and extend in the front-rear direction. Each third shaft 73 passes through a through hole 84A in the second bushing 84 and is rotatable with respect to the second bushing 84 and slidable in the axial direction. The fourth shafts 74 are supported by the third bushings 85 fastened to the second support members 54B in the first support 50 and extend in the front-rear direction. Each fourth shaft 74 passes through a through hole 85A in the third bushing 85 and is rotatable with respect to the third bushing 85 and slidable in the axial direction. The materials of the second bushings 84 and the third bushings 85 are also selected as appropriate such that the third shafts 73 and the fourth shafts 74 have predetermined rotatability and predetermined slidability, similarly to the first bushings 81.

Each third shaft 73 and the corresponding fourth shaft 74 are disposed in parallel with each other with the first support 50 interposed therebetween. Two third shafts 73 and 73 arranged in the front-rear direction are disposed on a straight line in the front-rear direction and coupled through the coupling portion 88 described later. Two fourth shafts 74 and 74 arranged in the front-rear direction are disposed on a straight line in the front-rear direction.

Each second shaft 72 is supported by the first block 82 and the second block 83 fastened to the bottom surface of the base 10A and extends in the left-right direction. The second shaft 72 passes through a through hole 82A in the first block 82 and a through hole 83A in the second block 83 and is rotatable with respect to the first block 82 and the second block 83 and slidable in the axial direction.

One end of the second shaft 72 in the left-right direction is coupled to the first shaft 71. Specifically, an end portion of the first shaft 71 passes through a through hole 72A in the second shaft 72. The other end of the second shaft 72 in the left-right direction is coupled to the third shaft 73. Specifically, an end portion of the third shaft 73 passes through a through hole 72B in the second shaft 72. The second shaft 72 is coupled to the fourth shaft 74 between the first block 82 and the second block 83 in the left-right direction. The second shaft 72 is coupled to the fourth shaft 74 through the fixing portion 86 fastened to the bottom surface of the base 10A. The fixing portion 86 absorbs the attachment tolerance between the fourth shaft 74 and the second shaft 72 and includes a through hole 86A through which the second shaft 72 passes through.

When the overhead transport vehicle 1 is viewed from the right, the third shaft 73 coupled to the first support 50 disposed on the front side and the third shaft 73 coupled to the first support 50 disposed on the rear side are coupled through the coupling portion 88. The coupling portion 88 is disposed at a position that is substantially the center of two second bushings 84 and 84 arranged in the front-rear direction. The coupling portion 88 has an inserted portion 88A having an inner diameter larger than the outer diameter of the third shaft 73 disposed on the front side and an inserted portion 88B having an inner diameter larger than the outer diameter of the third shaft 73 disposed on the rear side. The third shaft 73 is fixed, for example, at one location in the inserted portion 88A through a support member such as resin. Thus, the third shaft 73 is movable in the up-down and left-right directions in the inside of the inserted portion 88A.

Referring now to FIG. 3, an example of the operation of the first supports 50 will be described. Preload is applied in advance to the first biasing portion 58 that is a compression spring so that the first biasing portion 58 is not contracted when the holding device 11 holds an empty FOUP 90. Specifically, it is compressed so as to achieve a repelling force equal to the sum of the weights of the base 10A, the holding device 11, and the empty FOUP 90. The first biasing portion 58 is therefore compressed when the holding device 11 grips a FOUP 90 containing some content and a load greater than a first predetermined value is exerted on the first biasing portion 58. When a relatively light content is contained (when the amount of contraction of the first biasing portion 58 is equal to or less than a predetermined value), the base 10A does not come into contact with the end portion of the second biasing portion 91A. In other words, the base 10A is supported by the first body member 54 (coupling member 96) only through the first biasing portion 58.

When a load with a second predetermined value greater than the first predetermined value is exerted on the first biasing portion 58, the first biasing portion 58 is further compressed, so that the base 10A comes into contact with the end portion of the second biasing portion 91A. In other words, the base 10A is supported by the first body member 54 (coupling member 96) through the first biasing portion 58 and the second biasing portion 91A. Compared with when the base 10A is supported by the first body member 54 (coupling member 96) only through the first biasing portion 58, when the base 10A is supported by the first body member (coupling member 96) through the first biasing portion 58 and the second biasing portion 91A, the amount of sinking for the same weight (the amount of closeness between the base 10A and the first body member 54 (coupling member 96)) is reduced. In other words, the coefficient of restitution of the vibration isolator 50A switches at a point of time when a load with the second predetermined value is exerted on the first biasing portion 58.

When the first biasing portion 58 is contracted and the second biasing portion 91A comes into contact with the base 10A, a repelling force is produced in the second biasing portion 91A. The repelling force may cause vibration to the base 10A. The third biasing portion 92A disposed between the base 10A and the clamping member 95 absorbs a shock in the upward direction caused by the repelling force.

Referring now to FIG. 4, an example of the operation of the second support 40 will be described. Preload is applied in advance to the first biasing portion 48 that is a compression spring so that the first biasing portion 48 is not contracted when the holding device 11 holds an empty FOUP 90. Specifically, it is compressed so as to achieve a repelling force equal to the sum of the weights of the base 10A, the holding device 11, and the empty FOUP 90, in the same manner as in the first support 50. The first biasing portion 48 is therefore compressed when the holding device 11 grips a FOUP 90 containing some content and a load greater than a first predetermined value is exerted on the first biasing portion 48. When a relatively light content is contained (when the amount of contraction of the first biasing portion 48 is equal to or less than a predetermined value), the base 10A does not come into contact with the end portion of the second biasing portion 91B. In other words, the base 10A is supported by the fourth body member 46 only through the first biasing portion 48.

When a load with a second predetermined value greater than the first predetermined value is exerted on the first biasing portion 48, the first biasing portion 48 is further compressed, so that the base 10A comes into contact with the end portion of the second biasing portion 91B. In other words, the base 10A is supported by the fourth body member 46 through the first biasing portion 48 and the second biasing portion 91B. Compared with when the base 10A is supported by the fourth body member 46 only through the first biasing portion 48, when the base 10A is supported by the fourth body member 46 through the first biasing portion 48 and the second biasing portion 91B, the amount of sinking for the same weight (the amount of closeness between the base 10A and the fourth body member 46) is reduced. In other words, the coefficient of restitution of the vibration isolator 40A switches at a point of time when a load with the second predetermined value is exerted on the first biasing portion 48.

When the first biasing portion 48 is contracted and the second biasing portion 91B comes into contact with the base 10A, a repelling force is produced in the second biasing portion 91B. The repelling force may cause vibration to the base 10A. The third biasing portion 92B disposed between the base 10A and the clamping member 94 absorbs a shock in the upward direction caused by the repelling force.

Referring now to FIG. 5 to FIG. 7, an example of the operation of the link mechanism 70 coupling the second support 40 and each first support 50 arranged in the left-right direction will be described. For example, it is assumed that force is exerted on the first biasing portions 48 and 48 of the second support 40 on the left side due to centrifugal force during travel. When force is exerted on the first biasing portions 48 and 48 of the second support 40, the first biasing portions 48 and 48 are contracted and the fourth body member 46 moves upward (arrow D1). In other words, the distance between the fourth body member 46 and the base 10A is reduced. When the fourth body member 46 moves upward, the end portion on the side closer to the first bushing 81 of the first shaft 71 fixed to the fourth body member 46 through the first bushings 81 moves upward (arrow D2) with respect to the end portion on the side coupled to the second shaft 72.

When the end portion on the side closer to the first bushing 81 of the first shaft 71 moves upward, the second shaft 72 rotates clockwise (arrow D3) as viewed from the left. When the second shaft 72 rotates clockwise, the end portion on the side closer to the coupling portion 88 of the third shaft 73 coupled thereto moves upward (arrow D4) with respect to the end portion on the side coupled to the second shaft 72. When the second shaft 72 rotates clockwise, the end portion on the opposite side to the side coupled to the second shaft 72 of the fourth shaft 74 coupled thereto moves upward (arrow D4) with respect to the end portion on the side coupled to the second shaft 72. Then, the first body member 54 fixed to the third shaft 73 through the second bushing 84 and fixed to the fourth shaft 74 through the third bushing 85 is pushed upward (arrow D5). When the first body member 54 is pushed upward, a pair of first biasing portions 58 and 58 are contracted. In other words, the distance between the first body member 54 and the base 10A is reduced.

By contrast, when the first biasing portions 48 and 48 are expanded and the fourth body member 46 moves downward (the opposite direction to arrow D1), the end portion on the side closer to the first bushing 81 of the first shaft 71 moves downward (the opposite direction to arrow D2) with respect to the end portion on the side coupled to the second shaft 72. When the end portion on the side closer to the first bushing 81 of the first shaft 71 moves downward, the second shaft 72 rotates counterclockwise (the opposite direction to arrow D3) as viewed from the left. When the second shaft 72 rotates counterclockwise, the end portion on the side closer to the coupling portion 88 of the third shaft 73 moves downward (the opposite direction to arrow D4) with respect to the end portion on the side coupled to the second shaft 72, and the end portion on the opposite side to the side coupled to the second shaft 72 of the fourth shaft 74 moves downward (the opposite direction to arrow D4) with respect to the end portion on the side coupled to the second shaft 72. Thus, the first body member 54 is pushed downward (the opposite direction to arrow D5), and a pair of first biasing portions 58 and 58 are expanded.

In this way, in the link mechanism 70 coupling the second support 40 and each first support 50 arranged in the left-right direction, when the spring members of one of the second support 40 and the first support 50 are contracted or expanded, the second shaft 72 follows and rotates with respect to the first block 82 and the second block 83 fastened to the bottom surface of the base 10A, so that the spring members of the other of the second support 40 and the first support 50 are contracted or expanded. In other words, when a difference arises between the distance between the base 10A and the fourth body member 46 and the distance between the base 10A and the first body member 54 in the second support 40 and the first support 50 coupled to each other, the link mechanism 70 operates such that the distance between the base 10A and the fourth body member 46 and the distance between the base 10A and the first body member 54 in the second support 40 and the first support 50 coupled to each other are brought closer to each other.

The link mechanism 70 includes the second shaft 72 to produce stress (torsion stress) when a difference arises between the distance between the base 10A and the fourth body member 46 and the distance between the base 10A and the first body member 54 in the second support 40 and the first support 50 coupled to each other. Reaction force to the stress produced in the second shaft 72 acts as a force by which the distance between the base 10A and the fourth body member 46 and the distance between the base 10A and the first body member 54 in the second support 40 and the first support 50 coupled to each other are brought closer to each other.

An example of the operation of the link mechanism 70 coupling the first supports 50 arranged in the front-rear direction will now be described. For example, it is assumed that force is exerted on the first biasing portions 58 and 58 of the first support 50 on the rear side due to acceleration or deceleration during travel. When force is exerted on the first biasing portions 58 and 58 of the first support 50, the first biasing portions 58 and 58 are contracted and the first body member 54 moves upward (arrow D5). In other words, the distance between the first body member 54 and the base 10A is reduced. When the first body member 54 moves upward (arrow D5), the end portion on the side closer to the coupling portion 88 of the third shaft 73 fixed to the first body member 54 through the second bushing 84 moves upward (arrow D6) with respect to the end portion on the side coupled to the second shaft 72.

When the coupling portion 88 moves upward (arrow D6), the other third shaft 73 (the third shaft 73 disposed on the left side in FIG. 5) coupled to the coupling portion 88 also moves upward (arrow D6) at the end portion on the side closer to the coupling portion 88 with respect to the end portion on the side coupled to the second shaft 72. Thus, the first body member 54 of the first support 50 on the front side fixed to the third shaft 73 through the second bushing 84 is pushed upward (arrow D7). When the first body member 54 is pushed upward, a pair of first biasing portions 58 and 58 are contracted. In other words, the distance between the first body member 54 and the base 10A is reduced.

By contrast, when the first biasing portions 58 and 58 of the first support 50 on the front side are expanded, and the first body member 54 moves downward (the opposite direction to arrow D5), the end portion on the side closer to the coupling portion 88 of the third shaft 73 moves downward (the opposite direction to arrow D6) with respect to the end portion on the side coupled to the second shaft 72. When the coupling portion 88 moves downward, the other third shaft 73 coupled to the coupling portion 88 also moves downward (the opposite direction to arrow D6) at the end portion on the side closer to the coupling portion 88 with respect to the end portion on the side coupled to the second shaft 72. Thus, the first body member 54 of the first support 50 on the front side is pushed downward (the opposite direction to arrow D7). When the first body member 54 is pushed downward, a pair of first biasing portions 58 and 58 are expanded.

In this way, in the link mechanism 70 coupling the first supports 50 arranged in the front-rear direction, when the first biasing portions 58 and 58 of one of the first supports 50 are contracted or expanded, the motion of one of the third shafts 73 is followed by the motion of the other third shaft 73 with respect to the coupling portion 88 so that the first biasing portions 58 and 58 of the other first support 50 are contracted or expanded. In other words, the link mechanism 70 operates such that the respective distances between the base 10A and the respective first body members 54 and 54 in the first supports 50 coupled to each other are brought closer to each other.

The link mechanism 70 includes the third shafts 73 to produce stress when a difference arises between the respective distances between the base 10A and the respective first body members 54 in the first supports 50 coupled to each other. Reaction force to the stress produced in the third shaft 73 acts as a force by which the respective distances between the base 10A and the respective first body members 54 in the first supports 50 coupled to each other are brought closer to each other.

The operation effects of the overhead transport vehicle 1 in the foregoing preferred embodiment will be described. In the first supports 50 of the overhead transport vehicle 1 described above, when a relatively light FOUP 90 is gripped, only the repelling force (biasing force) of the first biasing portion 58 is exerted between the base 10A and the first body member 54 (coupling member 96), and when a relatively heavy FOUP 90 heavier than a second predetermined value is gripped, the repelling forces (biasing force) of both of the first biasing portion 58 and the second biasing portion 91A are exerted between the base 10A and the first body member 54 (coupling member 96). Similarly, in the second support 40 of the overhead transport vehicle 1 described above, when a relatively light FOUP 90 is gripped, only the repelling force of the first biasing portion 48 is exerted between the base 10A and the fourth body member 46, and when a relatively heavy FOUP 90 heavier than the second predetermined value is gripped, the repelling forces of both of the first biasing portion 48 and the second biasing portion 91B are exerted individually between the base 10A and the fourth body member 46. With this configuration, when a relatively light FOUP 90 is gripped, the action of the first biasing portion 58 (first biasing portion 48) can reduce vibration transmitted to the FOUP 90, and when a relatively heavy FOUP 90 is gripped, the mutual action between the first biasing portion 58 (first biasing portion 48) and the second biasing portion 91A (second biasing portion 91B) can reduce vibration transmitted to the FOUP 90. As a result, even when the weights of transported FOUPs 90 vary, vibration transmitted to the FOUP 90 can be reduced.

In the overhead transport vehicle 1 described above, the second biasing portions 91A and 91B include portions or a material that are viscoelastic. With this configuration, swaying of the FOUP 90 can be attenuated, and swaying of the FOUP 90 can be effectively reduced or prevented.

In the overhead transport vehicle 1 described above, the first biasing portions 48 and 58 are preloaded such that they are not compressed when an empty FOUP 90 is gripped. With this configuration, the first biasing portions 48 and 58 are not contracted even when an empty FOUP 90 is gripped, so that the second biasing portions 91A and 91B can be readily prevented from coming into contact with both of the first body member 54 (fourth body member 46) and the base 10A at the point of time when the empty FOUP 90 is gripped.

In the overhead transport vehicle 1 described above, the third biasing portions 92A and 92B are disposed between the first body member 54 (fourth body member 46) and the base 10A. With this configuration, vibration in rebounding when the second biasing portions 91A and 91B are compressed can be reduced.

In the overhead transport vehicle 1 described above, the third biasing portions 92A and 92B includes portions or a material that are viscoelastic. With this configuration, swaying of vibration in rebounding can be attenuated, and swaying of the FOUP 90 can be effectively reduced or prevented.

In the overhead transport vehicle 1 described above, since the base 10A is movable in the up-down direction with respect to the first body member 54 and the fourth body member 46 through the first biasing portion 58 and the first biasing portion 48, transmission of vibration to the article can be reduced or prevented when the traveling drive unit 3 travels or the elevating device 10 is elevated and lowered. Furthermore, in the overhead transport vehicle 1 described above, when a difference arises between the distance between the base 10A and the fourth body member 46 and the distance between the base 10A and the first body member 54 in the second support 40 and the first support 50 coupled to each other, the link mechanism 70 operates such that the distance between the base 10A and the fourth body member 46 and the distance between the base 10A and the first body member 54 in the second support 40 and the first support 50 coupled to each other are brought closer to each other. Accordingly, a rolling motion in the base 10A can be reduced or prevented. This configuration can reduce inclination in the base 10A and reduce or prevent swaying of the FOUP 90. As a result of these, it is possible to reduce or prevent swaying of the FOUP 90 while reducing vibration transmitted to the FOUP 90.

Since the link mechanism 70 couples two first supports 50 and the second support 40 arranged in left-right direction (width direction) orthogonal to both of the front-rear direction in which the traveling drive unit 3 travels and the up-down direction, rolling motion in the width direction that occurs during travel on a curve or when the FOUP 90 is transferred in the traverse direction can be reduced or prevented. Furthermore, since the link mechanism 70 couples two first supports 50 arranged in the direction in which the traveling drive unit 3 travels, rolling motion in the front-rear direction that occurs due to acceleration or deceleration during travel can be reduced or prevented.

Although preferred embodiments have been described above, aspects and preferred embodiments of the present invention is not limited to the foregoing aspects and preferred embodiments and are amenable to various modifications without departing from the spirit of the present invention.

In the foregoing preferred embodiments, an example in which the link mechanism 70 couples two first supports 50 and the second support 40 arranged in the left-right direction and couples two first supports 50 and 50 arranged in the front-rear direction has been described. However, the overhead transport vehicle 1 does not necessarily include the link mechanism 70. Even in this case, vibration transmitted to the FOUP 90 can be reduced even when the weights of transported FOUPs 90 vary.

In the foregoing preferred embodiments and modifications, an example in which the first support 50 is provided on the right side of the elevating device 10 in the left-right direction and the second support 40 is provided on the left side of the elevating device 10 in the left-right direction has been described. However, the present invention is not limited thereto. For example, the positions of the first supports 50 and the second support 40 in the left-right direction may be interchanged, or the first supports 50 or the second supports 40 may be disposed on both sides in the left-right direction.

In the foregoing preferred embodiments and modifications, an example in which the second biasing portions 91A and 91A are fastened to the first support member 54A has been described. However, they may be fastened to the lower surface of the base 10A. Similarly, an example in which the second biasing portions 91B and 91B are fastened to the third support member 46A has been described but they may be fastened to the lower surface of the base 10A.

Instead of or in addition to the first biasing portions 58 or the first biasing portions 48 in the foregoing preferred embodiments and modifications, for example, gel elastic bodies formed of silicone resin or the like may be disposed. Even in this case, vibration and shock can be absorbed in the same manner as when the first biasing portions 58 or the first biasing portions 48 are disposed.

In the foregoing preferred embodiments and modifications, an example in which the first supports 50 and the second support 40 arranged in the left-right direction are coupled by the link mechanism 70 and the first supports 50 arranged in the front-rear direction are coupled by the link mechanism 70 has been described. However, the present invention is not limited thereto. For example, the overhead transport vehicle may be configured such that only the first supports 50 and the second support 40 arranged in the left-right direction may be coupled by the link mechanism 70. Even in this case, a rolling motion in the width direction that occurs during travel on a curve or when the FOUP is transferred in the traverse direction can be reduced or prevented. Alternatively, the overhead transport vehicle may be configured such that only the first supports 50 arranged in the front-rear direction may be coupled by the link mechanism 70. Even in this case, a rolling motion in the front-rear direction that occurs due to acceleration or deceleration during travel can be reduced or prevented.

In the foregoing preferred embodiments and modifications, an example in which the second biasing portions 91A and 91A are disposed between the first support member 54A and the base 10A and the second biasing portions 91B and 91B are disposed between the third support member 46A and the base 10A has been described. However, the present invention is not limited thereto. For example, the second biasing portions 91A and 91A may be provided, for example, on the lower surface of the base 10A and may be provided at positions to which the third shafts 73 move when the first biasing portions 58 are contracted by a predetermined amount. In other words, the second biasing portions 91A and 91A may be provided so as to come into contact with the third shafts 73 when a FOUP 90 heavier than the second predetermined value is gripped. Similarly, the second biasing portions 91B and 91B may be provided so as to come into contact with the first shafts 71 when a FOUP 90 heavier than the second predetermined value is gripped.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. An overhead transport vehicle comprising:
a body to travel along a track; and
an elevator to be elevated and lowered by a suspension with respect to the body, the elevator including a gripper to grip an article; wherein
the elevator includes:
a base including the gripper,
a support to support the base to be vertically movable from below in a vertical direction through a vibration isolator, and
a shaft portion including one end disposed at the support, the shaft portion passing through a through hole provided in the base;
the vibration isolator includes:
a first biasing portion in contact with both of the support and the base to urge the support and the base in a direction away from each other; and
a second biasing portion located at one of the support and the base to come into contact with both of the support and the base and urge the support and the base in a direction away from each other when a load equal to or greater than a predetermined value is applied to the first biasing portion;
the shaft portion extends through the first biasing portion;
at the other end of the shaft portion, a clamp is provided to clamp a third biasing portion with the base; and
the third biasing portion is able to come into contact with both of the base and the clamp and urge the base and the clamp in a direction away from each other.

2. The overhead transport vehicle according to claim 1, wherein a plurality of the supports are disposed and coupled to each other by a link operable such that respective distances between the supports coupled to each other and the base are brought closer to each other.

3. The overhead transport vehicle according to claim 1, wherein the second biasing portion includes a portion or a material that is viscoelastic.

4. The overhead transport vehicle according to claim 1, wherein
the article is an empty container that does not contain a content or is a container that contains the content; and
the first biasing portion is preloaded such that the first biasing portion is not compressed when the empty container is gripped.

5. The overhead transport vehicle according to claim 1, wherein the third biasing portion includes a portion or a material that is viscoelastic.

6. The overhead transport vehicle according to claim 2, wherein the third biasing portion includes a portion or a material that is viscoelastic.

7. The overhead transport vehicle according to claim 3, wherein the third biasing portion includes a portion or a material that is viscoelastic.

8. The overhead transport vehicle according to claim 4, wherein the third biasing portion includes a portion or a material that is viscoelastic.

* * * * *